United States Patent
Holyoak et al.

(10) Patent No.: US 6,387,733 B1
(45) Date of Patent: May 14, 2002

(54) TIME-BASED SEMICONDUCTOR MATERIAL ATTACHMENT

(75) Inventors: Howard Joseph Holyoak, High Point; John Cody Bailey, Mebane, both of NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 09/862,872

(22) Filed: May 22, 2001

(51) Int. Cl.⁷ .............................................. H01L 21/44
(52) U.S. Cl. ...................................... 438/123; 257/684
(58) Field of Search .......................... 438/14, 107, 118, 438/106, 123; 257/684; 228/4.5; 324/755; 118/406

(56) References Cited

U.S. PATENT DOCUMENTS

| | | | |
|---|---|---|---|
| 4,129,881 A | 12/1978 | Reichel et al. ................. 357/82 |
| 4,157,273 A | 6/1979 | Brady ......................... 156/315 |
| 4,346,124 A | 8/1982 | Wood et al. ................... 427/82 |
| 4,545,840 A | 10/1985 | Newman et al. ............. 156/276 |
| 4,749,329 A | 6/1988 | Stout ........................... 414/627 |
| 5,215,608 A | 6/1993 | Stroud et al. ................. 156/64 |
| 5,336,357 A | 8/1994 | Layher et al. ............... 156/391 |
| 5,765,277 A | 6/1998 | Jin et al. ....................... 29/743 |
| 5,882,451 A | 3/1999 | Sasaki et al. ................. 156/64 |
| 5,994,165 A | 11/1999 | Yoshino et al. ............. 438/106 |
| 6,037,192 A | 3/2000 | Witzman et al. ............. 438/118 |
| 6,051,449 A | 4/2000 | Schrock ...................... 438/118 |
| 6,077,380 A | 6/2000 | Hayes et al. ................. 156/283 |
| 6,129,040 A | 10/2000 | Viggiano et al. ............ 118/323 |
| 6,135,340 A | 10/2000 | Stansbury ...................... 228/9 |
| 6,170,736 B1 | 1/2001 | Briehl et al. ................. 228/212 |
| 6,174,752 B1 | 1/2001 | Schrock ...................... 438/118 |
| 6,179,938 B1 | 1/2001 | Mannhart et al. ............. 156/64 |
| 6,336,974 B1 * | 1/2001 | Sajid ........................... 118/406 |
| 6,206,066 B1 | 3/2001 | Imanishi et al. ............ 156/356 |
| 6,309,913 B1 * | 10/2001 | Stroupe ...................... 438/123 |
| 6,320,397 B1 * | 11/2001 | Wood .......................... 324/755 |
| 6,321,970 B1 * | 11/2001 | Fogal .......................... 228/4.5 |

* cited by examiner

Primary Examiner—John F. Niebling
Assistant Examiner—Andre C Stevenson
(74) Attorney, Agent, or Firm—Winthrow & Terranova, P.L.L.C.

(57) ABSTRACT

The present invention controls attachment of a first semiconductor material, such as a semiconductor die, to a second semiconductor material, such as a bond pad, substrate, or the like. A placement tool is used to pick up the first semiconductor material and move it to a defined position above the top surface of the second semiconductor material. The second semiconductor material will have an adhesive, such as epoxy, applied to its top surface. From the defined position above the second semiconductor material, the placement tool is allowed to fall for an amount of time previously determined to result in an adhesive layer of a defined thickness, within precise tolerances. The adhesive thickness is often referred to as bond line thickness (BLT) when bonding a semiconductor die to a bond pad, substrate, or the like.

21 Claims, 6 Drawing Sheets

TIME-BASED SEMICONDUCTOR MATERIAL ATTACHMENT

FIELD OF THE INVENTION

The present invention relates to attaching a die or other material to another surface, and in particular, relates to using a time-based technique for controlling such attachment.

BACKGROUND OF THE INVENTION

The semiconductor industry uses a variety of techniques to attach semiconductor die to bond pads, substrates, or like semiconductor materials during manufacturing. The equipment used to facilitate such attachment is commonly referred to as a die bonder. A die bonder typically operates to pick up a semiconductor die and attach it to another semiconductor structure using an epoxy or like adhesive. Die bonders are well known in the art, and are available from a variety of equipment vendors. A continuing problem with existing die bonders is the inability to accurately control the thickness of the epoxy layer between the semiconductor die and the structure to which it is attached. The resulting thickness of the epoxy after attachment is commonly referred to as the bond line thickness (BLT).

The die bonder generally incorporates a placement tool that has a head, which picks up a semiconductor die, positions it over the structure to which the semiconductor die is to be mounted, and lowers the semiconductor die onto the structure for attachment. Notably, the epoxy is previously applied to the surface upon which the semiconductor die is to be mounted. Existing die bonders struggle to provide BLT accuracies within 25 to 50 microns with relatively large semiconductor die. For relatively small semiconductor die, such as those having a top surface area of less than 2 mm square, and in particular, for semiconductor die less than 1 mm by 1 mm, these machines are incapable of providing reliable accuracy during attachment. Further, smaller semiconductor die typically require an actual BLT, which is often less than the variance for existing die bonders. For example, most die bonders provide BLT accuracies within plus or minus 20 microns, wherein smaller semiconductor die may require an actual BLT of 12 microns plus or minus 2 or 3 microns. As such, existing configurations of die bonders inject intolerable variations in construction parameters for the semiconductor.

Existing die bonders typically use one of two techniques for attaching the semiconductor die to a desired mounting surface. The first technique uses force to determine when to stop lowering the semiconductor die toward the mounting structure. For smaller semiconductor die and smaller BLT requirements, existing systems are not sensitive enough to detect any force prior to the semiconductor die being forced against the mounting structure, and thus, forcing the epoxy out from between the semiconductor die and the mounting structure. As such, maintaining a relatively small BLT is virtually impossible, because the semiconductor die is forced against the mounting surface. The second technique relies on moving the semiconductor die to a set height above the mounting structure. For smaller semiconductor die and smaller BLT requirements, using a set height is unacceptable because mounting substrates often vary many times more than the actual bond line thickness.

Accordingly, there is a need for a semiconductor die attachment technique capable of providing accuracy far surpassing that of existing systems. There is a further need to provide this technique for smaller semiconductor die having smaller BLT requirements. Preferably, the technique would provide BLTs having an accuracy of plus or minus a few microns.

SUMMARY OF THE INVENTION

The present invention controls attachment of a first semiconductor material, such as a semiconductor die, to a second semiconductor material, such as a bond pad, substrate, or the like. A placement tool is used to pick up the first semiconductor material and move it to a defined position above the top surface of the second semiconductor material. The second semiconductor material will have an adhesive, such as epoxy, applied to its top surface From the defined position above the second semiconductor material, the placement tool is allowed to fall for an amount of time previously determined to result in an adhesive layer of a defined thickness, within precise tolerances. The adhesive thickness is often referred to as bond line thickness (BLT) when bonding a semiconductor die to a bond pad, substrate, or the like. After falling for the predefined period of time, the placement tool is stopped and removed, wherein the first semiconductor material remains adhered above the top surface of the second semiconductor material at a defined height, which correlates to an adhesive layer having a predefined thickness.

Preferably, a die bonder is used to control placement of the placement tool. The die bonder may use a vacuum-based control system to control vertical movement of the placement tool. As such, when in the first position above the second semiconductor material, the vacuum is shut off and the placement tool falls toward the second semiconductor material as the vacuum decays. After the predetermined period of time has elapsed, the descent of the placement tool is stopped, wherein the placement tool may be removed to pick up another first semiconductor material for placement. The defined period of time for descent of the tool and first semiconductor material includes a first period wherein the placement tool and first semiconductor material descend through air prior to impacting the adhesive on the second semiconductor material. The placement tool and first semiconductor material will continue to fall into the adhesive, wherein the adhesive is spread and compressed evenly between the bottom surface of the first semiconductor material and the top surface of the second semiconductor material. As noted, the period of time for descent is sufficient to result in an adhesive thickness of a predefined dimension within precise tolerances. For best results, the viscosity, amount, and shape of the adhesive initially placed on the top surface of the second semiconductor material remains constant for consecutive operations.

The present invention may be implemented in the form of a process or method on various types of bonding systems. Further, the concepts of the invention may be embodied in software used to carry out control of these systems.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIG. 1 is a perspective view of a portion of a semiconductor including a semiconductor die attached to a bond pad on a substrate using epoxy according to a preferred embodiment of the present invention.

FIGS. 2A, 2B, and 2C represent various stages of the attachment process according to a preferred embodiment of the present invention.

DETAILED DESCRIPTION OF THE PREFERRED EMBODIMENTS

Unlike existing semiconductor die attachment techniques, the present invention controls attachment based on a timed descent. In essence, the semiconductor die is moved to a defined position above the surface to which it is to be mounted, which already includes epoxy. From the defined position, the placement tool holding the semiconductor die is allowed to fall for an amount of time previously determined to result in the given bond line thickness (BLT), within very precise tolerances.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
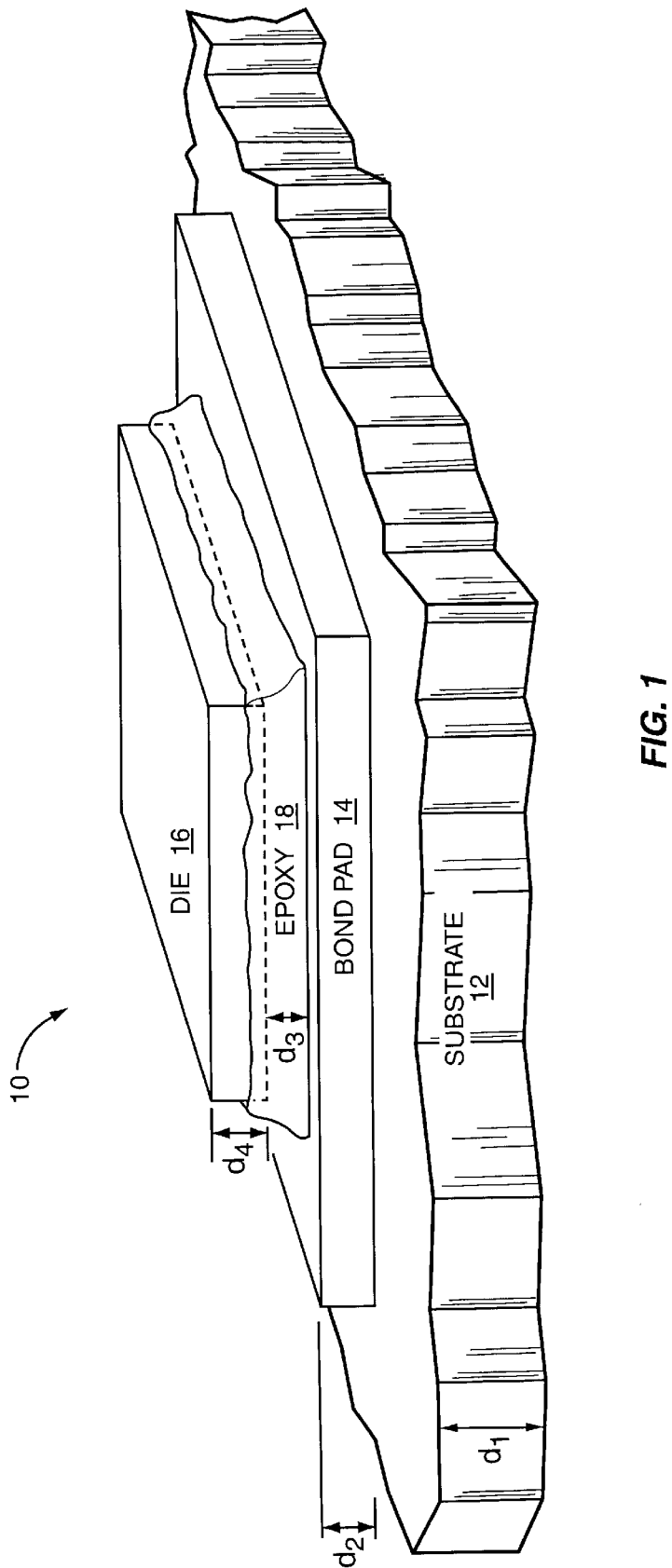

FIG. 1 illustrates a section of a semiconductor structure, generally referenced as 10, which includes a substrate 12, with a bond pad 14 mounted thereon. A semiconductor die 16 is attached to the bond pad 14 using an epoxy 18. Note that these structures are not properly scaled, and are illustrated as such to facilitate an understanding of the inventive concepts. Those skilled in the art will recognize that the semiconductor material upon which the semiconductor die 16 or other material is mounted will vary from application to application. Semiconductor materials are defined broadly for the present invention, and may include any type of material used to form semiconductor die 16, bond pad 14, or substrates 12. For the purposes of illustration only, the following description relates to placing the semiconductor die 16 on a bond pad 14, which is attached to a substrate 12. Those skilled in the art will recognize that the semiconductor die 16 may be attached to any type of surface, and that the present invention is applicable wherein resultant adhesive thickness between two semiconductor structures requires tolerances supported by the present invention.

For the purposes of perspective only, the substrate 12 may be approximately 0.5 mm 70.05 mm thick (D1), the bond pad 14 is typically between 0.022 and 0.053 mm (D2), the BLT (D3) may vary greatly; however, the present invention is particularly useful when the required BLT is less than about 30 microns and requires a variance within plus or minus 2 to 4 microns. Preferably, the BLT is between 12 and 18 microns, with an optimum thickness of 14 microns with a variance of plus or minus 2 to 3 microns for the particular examples described below. The thicknesses of the semiconductor die 16 also vary, but are typically approximately 100–300 microns. Further, the semiconductor die 16 benefiting most from the present invention have a top surface of less than 1 square mm (1 mm by 1 mm) to 4 square mm (2 mm by 2 mm). For the examples described below, the die size is preferably between 0.5 mm by 0.6 mm and 2 mm by 2 mm. Those skilled in the art will recognize that the present invention is also applicable to semiconductor die 16 outside of the ranges described.

Figure 2A:
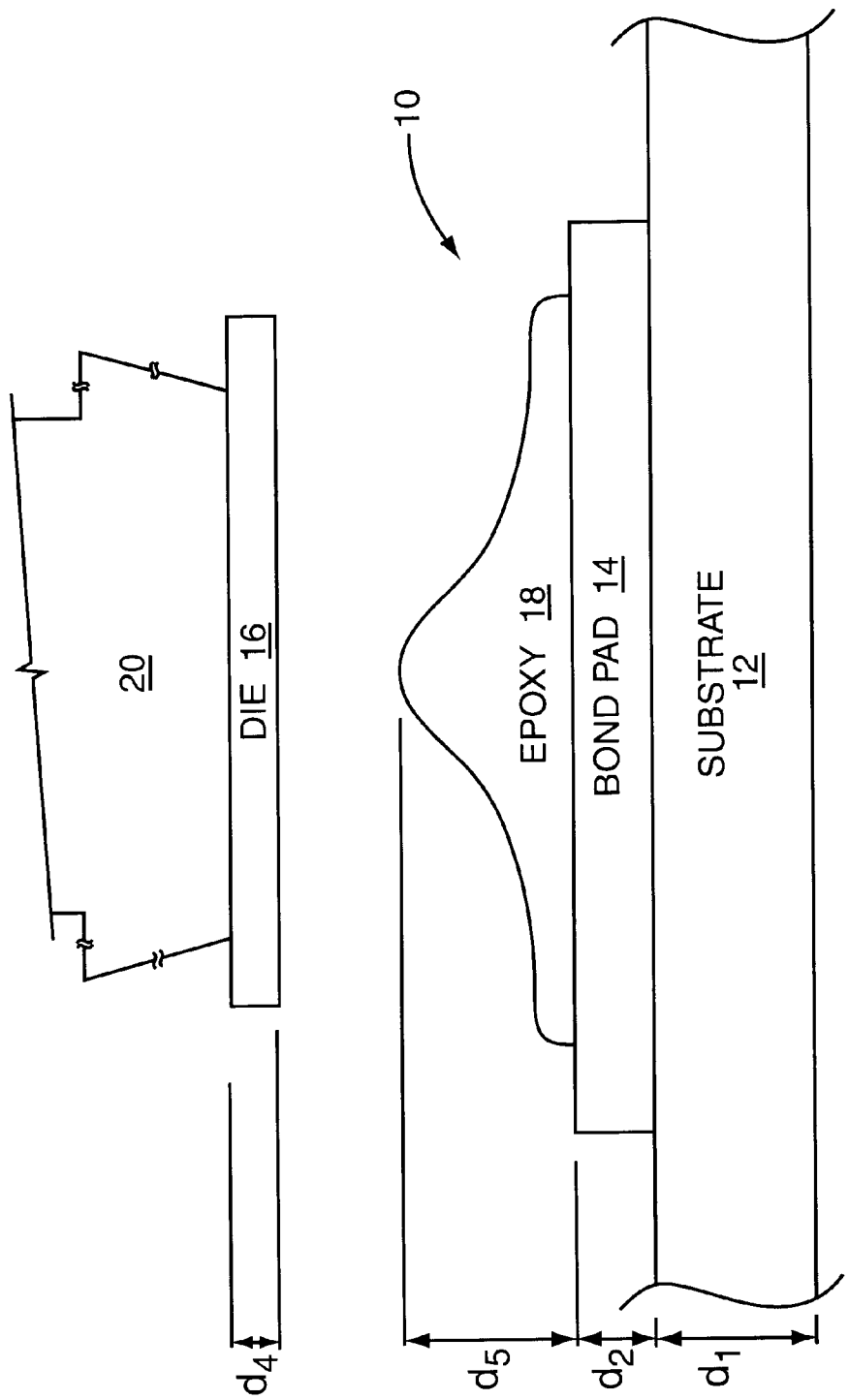
Figure 2B:
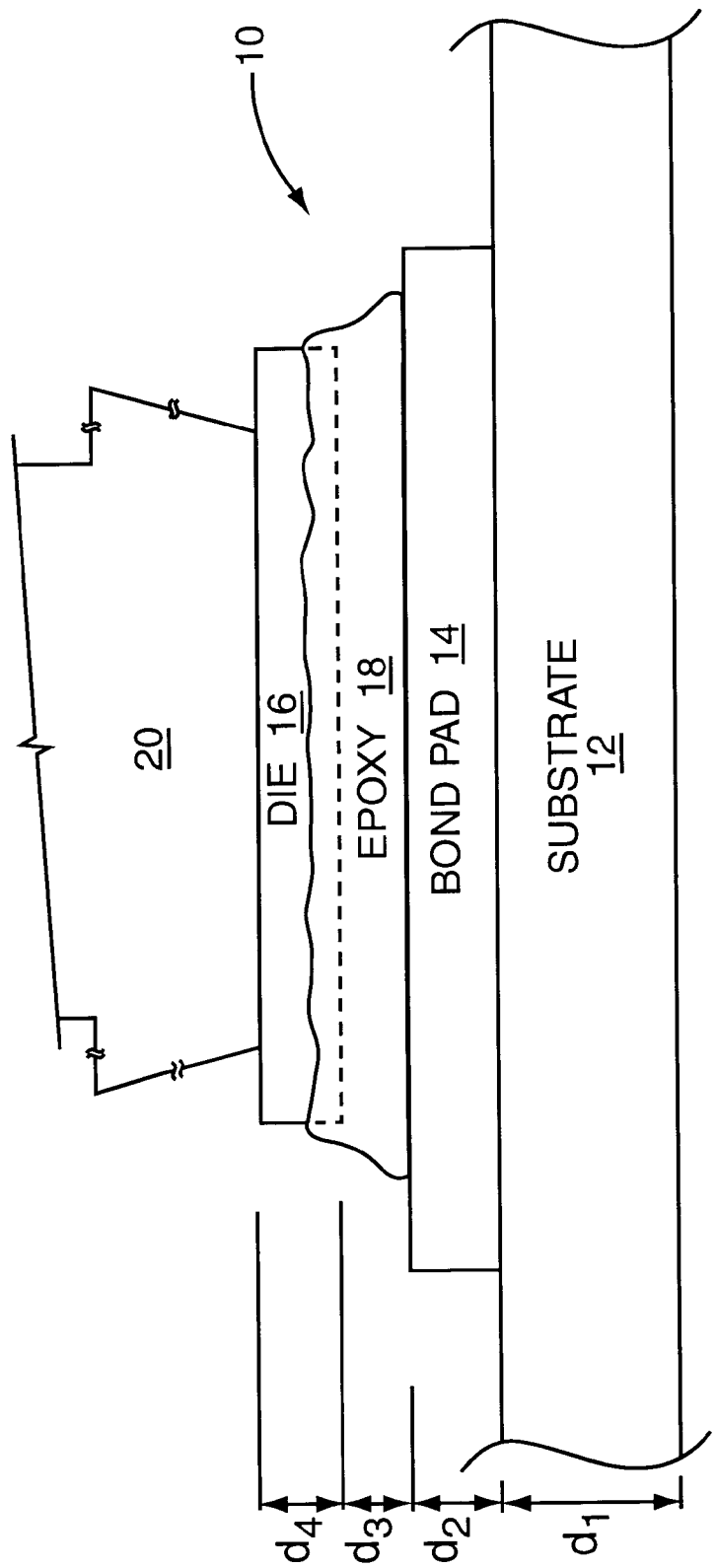
Figure 2C:
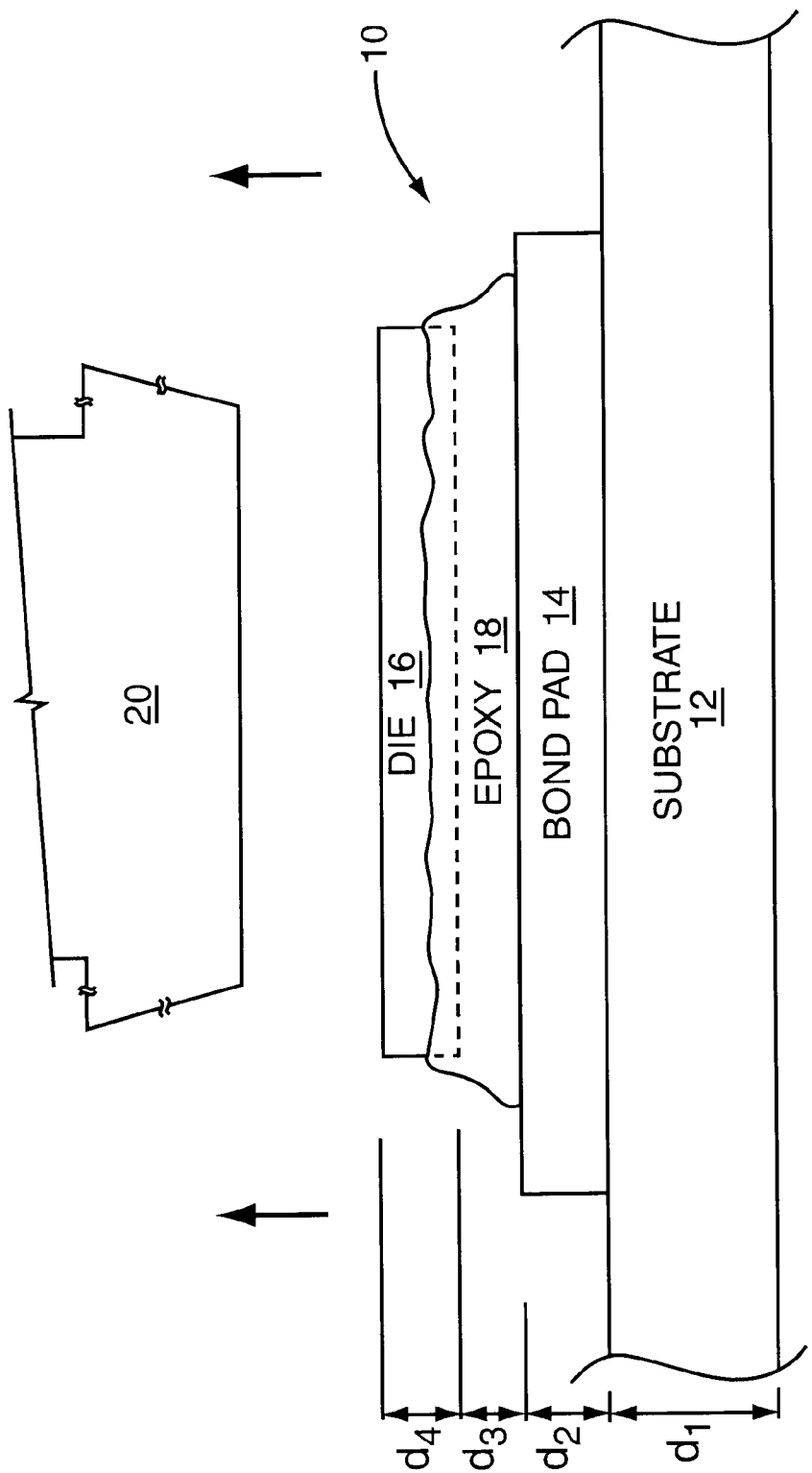
Figure 3:
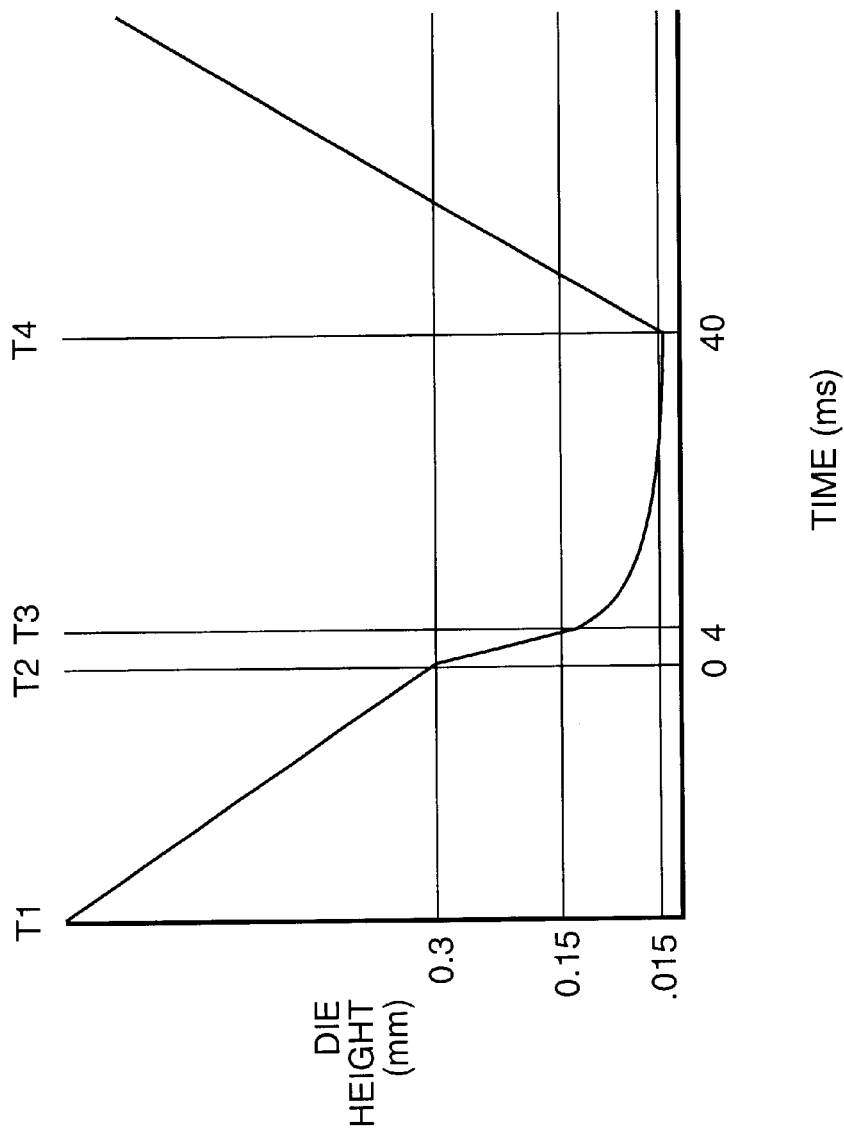
FIG. 3 is a diagram illustrating the relationship between the semiconductor die height relative to a mounting structure versus time according to a preferred embodiment of the present invention.

Turning now to FIGS. 2A, 2B, 2C, and 3, the process of attaching a semiconductor die 16 to a bond pad 14 while providing an accurate and repeatable BLT is described. FIGS. 2A, 2B, and 2C illustrate the relative movement and placement of the semiconductor die 16 relative to the bond pad 14, and FIG. 3 provides a graph illustrating the height of the semiconductor die 16 relative to the bond pad 14 over time. Preferably, the placement tool 20 will pick up the semiconductor die 16 prior to time T1 and move the semiconductor die 16 directly above the bond pad 14 by a predetermined height, or starting position prior to descent, between times T1 and T2. As will be discussed in greater detail below, the relative height of the semiconductor die 16 is not extremely critical, as long as the height is substantially repeatable. For the purposes of example, assume that the semiconductor die 16 is placed and held above the bond pad 14 by approximately 0.3 mm. The exact distance between the bottom surface of the semiconductor die 16 and the top surface of the bond pad 14 will vary with the thicknesses of the semiconductor die 16, bond pad 14, and substrate 12.

At this point (T2), the placement tool 20 is allowed to fall toward the bond pad 14 for a predefined period of time (T2 to T4). During this timed descent, which is 40 ms for the present example, the semiconductor die 16 will travel through air for a first period (T2 to T3) and into the epoxy 18 for a second period (T3 through T4). Preferably, the timed descent for the predefined period of time (T2 to T4) minimizes the effect of any initial variances in the height between the semiconductor die 16 and the bond pad 14, because the amount of time necessary for the semiconductor die 16 to fall through the air and reach the epoxy 18 is significantly less, and roughly an order of magnitude less for the given example, than the total timed descent. As such, any variances in the distance between the epoxy 18 and the semiconductor die 16 at the beginning of the timed descent (T2) have little, or at least minimized, impact on the resultant PLT.

Assuming that the placement tool 20 has sufficient weight to force the semiconductor die 16 into the epoxy 18, the rate of descent of the semiconductor die 16 will exponentially decline after contacting the epoxy 18. After contact, the semiconductor die 16, under the weight of the placement tool 20, will evenly displace the epoxy 18 between the semiconductor die 16 and the bond pad 14. At the end of the timed descent (T4), the placement tool 20 is removed, and the semiconductor die 16 is left partially submerged in the epoxy 18.

Preferably, preliminary experimentation or dynamic analysis and subsequent calibration are used to determine the predefined period of time for the timed descent. For best results, the viscosity, amount, and shape of the epoxy 18 initially placed on the bond pad 14 should remain constant for consecutive operations. Further, the weight and the fall characteristics of the placement tool 20 should remain constant. The epoxy 18 is preferably an Able Stick 84-LMI1SR4 having a viscosity of 8000 cps. The placement tool is approximately 7 grams. The epoxy 18 is also preferably placed on the bond pad 14 in a cross-like pattern having a cross-section shaped as illustrated in FIG. 2A.

Although the descent time through air (T2 to T3) is substantially less than the fall time within the epoxy 18 (T3 to T4), the relative starting position of the semiconductor die 16 for the timed descent should also remain relatively constant for optimal results. Those skilled in the art will recognize that substrate thickness will vary, thus varying the relative height of the semiconductor die 16 to the bond pad 14. The present invention minimizes the impact of such variation.

Although the descent rate and characteristics of the placement tool 20 may vary greatly, the preferred embodiment incorporates a placement tool 20 that has its vertical movement substantially controlled by a vacuum. The period of the timed descent coincides with releasing a vacuum used to hold the placement tool 20 in its initial position (at time T2) to allow the placement tool 20 and semiconductor die 16 to fall toward and into the epoxy 18 until the end of the period of the timed descent (T4). Thus, in the preferred embodiment, the placement tool 20 falls according to a decaying vacuum throughout the timed descent and is stopped or picked up at the end of the timed descent (T4).

For the sake of conciseness and readability, only the essential elements of the die bonder are reproduced and described herein. In the preferred embodiment, an ESEC 2008 die bonder with a vacuum-controlled placement tool FCBH1, which allows vertical movement of the placement tool 20 and related assembly, was modified for the present invention. Additional detail regarding the operation and specifications of the ESEC 2008 die bonder are available from Newark Electronics. Additional information pertaining to semiconductor die bonders may be found in U.S. Pat. No. 6,170,736, which is incorporated herein by reference in its entirety, and like patents.

Figure 4:
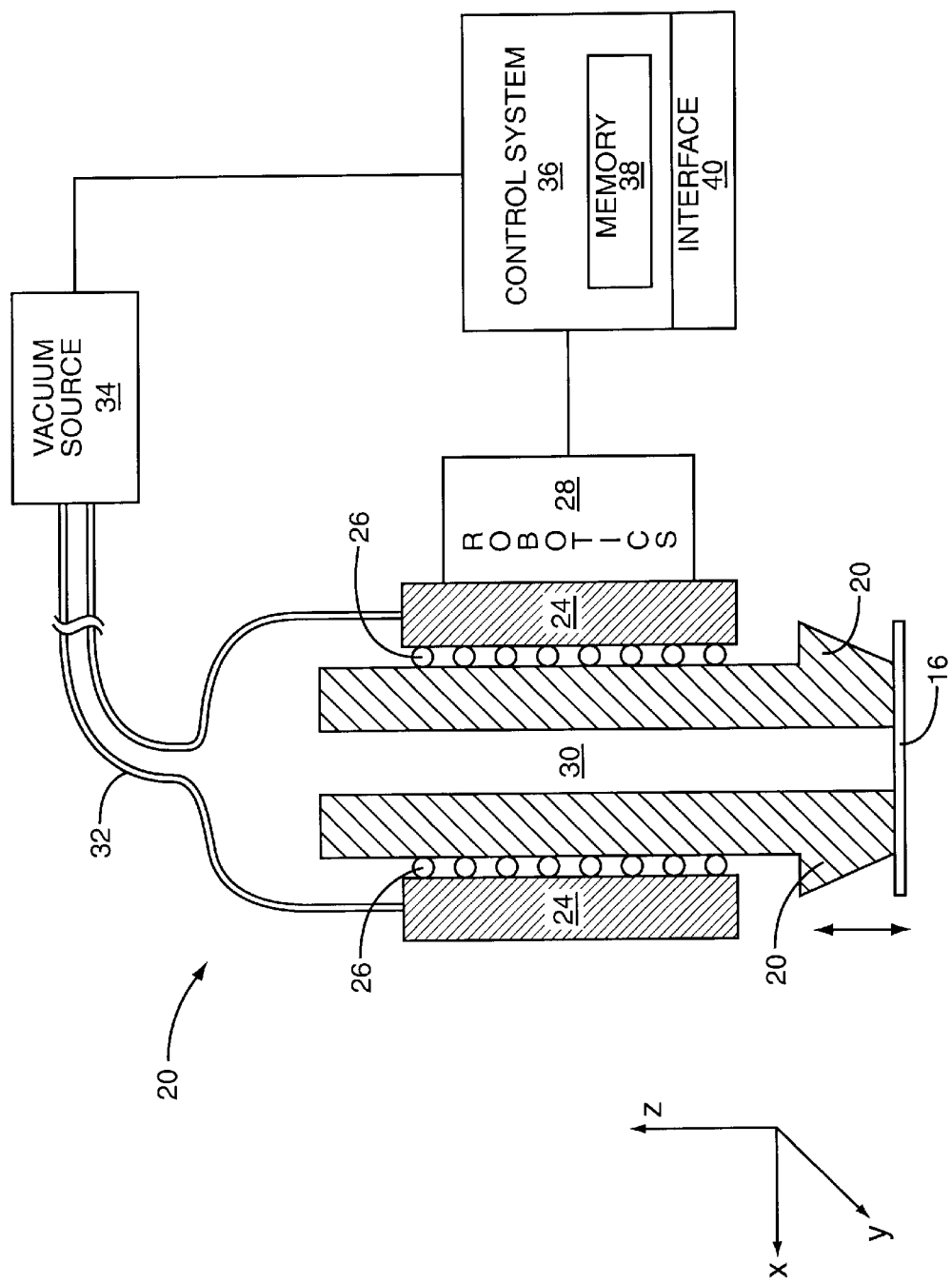
FIG. 4 illustrates key aspects of a die bonder according to a preferred embodiment of the present invention.

With reference to FIG. 4, the placement tool 20 is shown as part of a semiconductor die bonder 22. In particular, the placement tool 20 has a head portion for picking and placing the semiconductor die 16 and a shaft extending through a mounting device 24. Ball bearings are provided to enable low-friction movement of the placement tool 20 in relation to the mounting device 24. Typically, robotics 28 are provided to enable lateral movement of the die placement system 22 relative to the substrate 12. Although vertical movement is primarily provided through a reciprocating action of the placement tool 20 relative to the mounting device 24, the robotics 28 may be configured to move the entire apparatus vertically, including the mounting device 24 and the placement tool 20.

The placement tool 20 typically includes a central vacuum chamber 30 extending throughout its length as depicted. Preferably, the vacuum chamber 30 is sufficiently sized to allow a vacuum created in vacuum tubing 32 by vacuum source 34 to move the placement tool 20 up and down, while simultaneously using a portion of the vacuum to pick up and hold the semiconductor die 16. In other words, the vacuum chamber 30 is small enough and the vacuum available great enough that the placement tool 20 can be moved up and down without a semiconductor die 16 covering the entrance to the vacuum chamber 30. Accordingly, the vacuum created in the vacuum chamber 30 is sufficient to pick up and hold the semiconductor die 16 in place during transport.

The robotics 28 and vacuum source 34 are controlled by a control system 36 having memory 38 with sufficient software and data to control operation of the die bonder 22. The control system 36 will also preferably include a user interface 40 to allow programming, operation, and other control of the die bonder 22.

As noted above, the timed descent for the predefined period of time is preferably triggered by releasing the placement tool 20 to fall toward the bond pad 14 and into epoxy 18. In the configuration illustrated in FIG. 4, initiation of the timed descent is triggered by instructing the vacuum source 34 to release the vacuum maintained within the vacuum tubing 32 and the vacuum chamber 30 within the placement tool 20. With the ESEC 2008 die bonder, the vacuum, when released, decays and allows the placement tool 20 to fall toward the bond pad 14 and into the epoxy 18 in a repeatable fashion. Although the vacuum is released, the semiconductor die 16 is sufficiently small that surface tension or static electricity will operate to maintain the semiconductor die 16 on the bottom surface of the placement tool 20 from the time the timed descent begins and throughout the time in which the semiconductor die 16 is forced into the epoxy 18. The epoxy 18 will hold the semiconductor die 16 in place as the placement tool 20 is stopped and moved away from the bond pad 14.

Those skilled in the art will recognize improvements and modifications to the preferred embodiments of the present invention. All such improvements and modifications are considered within the scope of the concepts disclosed herein and the claims that follow. As such, processes, methods, and systems using a timed descent for attaching a semiconductor die 16 or like structure to another semiconductor structure to achieve a highly accurate resulting adhesive thickness are considered within the scope of this disclosure and the claims that follow.

What is claimed is:

1. A method for attaching semiconductor materials during manufacture comprising:
   a) moving a placement tool carrying a first semiconductor material to a first position over a second semiconductor material having an adhesive placed thereon;
   b) releasing the placement tool to fall toward the second semiconductor material for a predefined period of time, which is predetermined to allow the placement tool to fall toward and into the adhesive sufficiently to leave a defined thickness of the adhesive between the first and second semiconductor materials; and
   c) stopping the fall of the placement tool after the predefined period of time.

2. The method of claim 1 wherein the first semiconductor material is a semiconductor die.

3. The method of claim 2 wherein the second semiconductor material is a bond pad and the defined thickness of the adhesive is a desired bond line thickness for the adhesive between the semiconductor die and the bond pad.

4. The method of claim 1 wherein the stopping step comprises moving the placement tool away from the second semiconductor material.

5. The method of claim 1 further comprising determining the predefined period of time by identifying a time necessary to allow the placement tool to descend from the first position to the adhesive and into the adhesive to leave the defined thickness of the adhesive between the first and second semiconductor materials.

6. The method of claim 1 further comprising controlling a vertical position of the placement tool using a vacuum and wherein the releasing step comprises releasing the vacuum to allow the placement tool to fall as the vacuum decays.

7. The method of claim 1 further comprising initially picking up the first semiconductor material with the placement tool.

8. The method of claim 1 further comprising placing the adhesive on the second semiconductor material in a predefined fashion.

9. A method for attaching semiconductor die during manufacture comprising:

a) moving a placement tool carrying a semiconductor die to a first position over a second semiconductor material having an adhesive placed thereon;

b) releasing the placement tool to fall toward the second semiconductor material for a predefined period of time, which is predetermined to allow the placement tool to fall toward and into the adhesive sufficiently to leave a predefined bond line thickness for the adhesive between the semiconductor die and the second semiconductor material; and c) stopping the fall of the placement tool after the predefined period of time.

10. The method of claim 9 wherein the second semiconductor material is a bond pad mounted on a substrate.

11. The method of claim 9 further comprising determining the predefined period of time by identifying a time necessary to allow the placement tool to descend from the first position to the adhesive and into the adhesive to leave the predefined bond line thickness for the adhesive between the first and second semiconductor materials.

12. A system for controlling attachment of semiconductor materials during manufacture of a semiconductor comprising a control system with a placement tool adapted to pick up and move a first semiconductor material, said control system adapted to:

a) move the placement tool carrying the first semiconductor material to a first position over a second semiconductor material having an adhesive placed thereon;

b) release the placement tool to fall toward the second semiconductor material for a predefined period of time, which is predetermined to allow the placement tool to fall toward and into the adhesive sufficiently to leave a defined thickness of the adhesive between the first and second semiconductor materials; and c) stop the fall of the placement tool after the predefined period of time.

13. The system of claim 12 wherein the first semiconductor material is a semiconductor die.

14. The system of claim 13 wherein the second semiconductor material is a bond pad and the defined thickness of the adhesive is a desired bond line thickness for the adhesive between the semiconductor die and the bond pad.

15. The system of claim 12 wherein the control system is adapted to stop the fall of the placement tool by moving the placement tool away from the second semiconductor material after the predefined period of time elapses.

16. The system of claim 12 wherein the predefined period of time is determined by identifying a time necessary to allow the placement tool to descend from the first position to the adhesive and into the adhesive to leave the defined thickness of the adhesive between the first and second semiconductor materials.

17. The system of claim 12 further comprising a vacuum system adapted to control a vertical position of the placement tool using a vacuum and wherein the control system is adapted to release the placement tool by releasing the vacuum to allow the placement tool to fall as the vacuum in the vacuum system decays.

18. The system of claim 12 wherein the control system is further adapted to initially pick up the first material with the placement tool prior to moving the placement tool to the first position.

19. A system for attaching semiconductor materials during manufacture comprising:

a) means for placement of a first semiconductor material;

b) means for moving the means for placement carrying the first semiconductor material to a first position over a second semiconductor material having an adhesive placed thereon;

c) means for releasing the means for placement to fall toward the second semiconductor material for a predefined period of time, which is predetermined to allow the means for placement to fall toward and into the adhesive sufficiently to leave a defined thickness of the adhesive between the first and second semiconductor materials; and d) means for stopping the fall of the means for placement after the predefined period of time.

20. The system of claim 19 wherein the first semiconductor material is a semiconductor die.

21. The method of claim 20 wherein the second semiconductor material is a bond pad and the defined thickness of the adhesive is a desired bond line thickness for the adhesive between the semiconductor die and bond pad.

* * * * *